United States Patent
Boday et al.

(10) Patent No.: US 11,621,210 B2
(45) Date of Patent: Apr. 4, 2023

(54) THERMAL INTERFACE MATERIAL (TIM) WITH THERMALLY CONDUCTIVE INTEGRATED RELEASE LAYER

(71) Applicant: International Business Machines Corporation, Armonk, NY (US)

(72) Inventors: Dylan J. Boday, Tucson, AZ (US); Joseph Kuczynski, North Port, FL (US); Jason T. Wertz, Pleasant Valley, NY (US); Jing Zhang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 610 days.

(21) Appl. No.: 15/484,391

(22) Filed: Apr. 11, 2017

(65) Prior Publication Data
US 2017/0221791 A1    Aug. 3, 2017

Related U.S. Application Data

(62) Division of application No. 13/495,132, filed on Jun. 13, 2012, now Pat. No. 9,716,055.

(51) Int. Cl.
*B32B 9/00* (2006.01)
*B32B 15/20* (2006.01)
(Continued)

(52) U.S. Cl.
CPC ............ *H01L 23/373* (2013.01); *B32B 9/007* (2013.01); *B32B 9/041* (2013.01); *B32B 15/043* (2013.01);
(Continued)

(58) Field of Classification Search
None
See application file for complete search history.

(56) References Cited

U.S. PATENT DOCUMENTS 3,686,930 A    8/1972  Kniebes et al.
3,748,827 A    7/1973  Bulian et al.
(Continued)

FOREIGN PATENT DOCUMENTS

DE    19857697 A1    6/2000
DE    102005056052 A1    5/2007
(Continued)

OTHER PUBLICATIONS

English machine translation JPS61144339 (1986).*
(Continued)

*Primary Examiner* — Kenneth J Stachel
(74) *Attorney, Agent, or Firm* — Robert J. Shatto (57) ABSTRACT

A thermal interface material (TIM) includes a modified release layer having an organosilane-coated surface covalently bound to a TIM formulation layer. The modified release layer may be formed by applying an organosilane (e.g., vinyltriethoxysilane) to the surface of a thermally conductive release layer (e.g., aluminum foil). The organosilane reacts with hydroxyl groups on the surface of the thermally conductive release layer. The TIM formulation layer may be formed by applying a TIM formulation (e.g., a graphite TIM formulation) containing an unsaturated monomer (e.g., methyl acrylate) to the organosilane-coated surface of the modified release layer, and then curing the TIM formulation so that the unsaturated monomer of the TIM formulation reacts with the organosilane-coated surface of the modified release layer.

8 Claims, 4 Drawing Sheets

(51) Int. Cl.
  *B32B 15/04*    (2006.01)
  *H01L 23/40*    (2006.01)
  *H01L 23/373*   (2006.01)
  *H01L 23/42*    (2006.01)
  *B32B 9/04*     (2006.01)
  *H01L 21/48*    (2006.01)
  *H01L 23/367*   (2006.01)

(52) U.S. Cl.
  CPC .......... *B32B 15/20* (2013.01); *H01L 21/4882* (2013.01); *H01L 23/367* (2013.01); *H01L 23/4006* (2013.01); *H01L 23/42* (2013.01); *B32B 2255/06* (2013.01); *B32B 2255/26* (2013.01); *B32B 2307/302* (2013.01); *B32B 2307/748* (2013.01); *H01L 2924/0002* (2013.01); *Y10T 428/31663* (2015.04)

(56) References Cited

U.S. PATENT DOCUMENTS

| | | |
|---|---|---|
| 3,936,976 A | 2/1976 | Porter et al. |
| 3,956,179 A | 5/1976 | Sebastian et al. |
| 4,115,081 A | 9/1978 | Ohno et al. |
| 4,338,233 A * | 7/1982 | Das .................. C03C 25/26 19/236 |
| 4,425,117 A | 1/1984 | Hugemann et al. |
| 4,549,910 A * | 10/1985 | Barba .................. C25D 11/246 148/272 |
| 4,657,843 A | 4/1987 | Fukuyama et al. |
| 4,670,299 A | 6/1987 | Fukuyama et al. |
| 4,731,925 A | 3/1988 | Tanishi et al. |
| 4,781,733 A | 11/1988 | Babcock et al. |
| 4,904,632 A | 2/1990 | Pesek et al. |
| 4,950,314 A | 8/1990 | Yamada et al. |
| 4,965,062 A | 10/1990 | Van Dijk et al. |
| 5,147,957 A | 9/1992 | Kumar |
| 5,233,071 A | 8/1993 | Wilczek |
| 5,286,280 A | 2/1994 | Chiou |
| 5,358,795 A * | 10/1994 | Nakamura ........... B23K 20/227 257/720 |
| 5,733,663 A | 3/1998 | Scheunemann et al. |
| 5,741,579 A | 4/1998 | Nishizawa |
| 5,777,007 A | 7/1998 | Kagawa et al. |
| 5,876,739 A | 3/1999 | Turnblad et al. |
| 5,925,595 A | 7/1999 | Seitz et al. |
| 6,001,943 A | 12/1999 | Enami et al. |
| 6,060,530 A | 5/2000 | Chaouk |
| 6,165,253 A | 12/2000 | Sirkar et al. |
| 6,339,166 B1 | 1/2002 | Allcock et al. |
| 6,417,236 B1 | 7/2002 | Hobson et al. |
| 6,514,439 B2 | 2/2003 | Van Koppenhagen et al. |
| 6,673,246 B2 | 1/2004 | Markowitz et al. |
| 6,682,751 B1 | 1/2004 | Hargrove et al. |
| 6,710,181 B2 | 3/2004 | Kumagai et al. |
| 6,744,269 B1 | 6/2004 | Johnson et al. |
| 6,805,964 B2 | 10/2004 | Clouser et al. |
| 6,858,634 B2 | 2/2005 | Asrar et al. |
| 6,900,154 B2 | 5/2005 | McCullough et al. |
| 6,900,269 B2 | 5/2005 | Hwang et al. |
| 6,972,249 B2 | 12/2005 | Akram et al. |
| 6,986,943 B1 | 1/2006 | Cook et al. |
| 7,056,522 B2 | 6/2006 | Voris et al. |
| 7,101,394 B2 | 9/2006 | Hamm et al. |
| 7,169,832 B2 | 1/2007 | Poppe et al. |
| 7,211,192 B2 | 5/2007 | Shea et al. |
| 7,553,901 B2 | 6/2009 | Horikoshi et al. |
| 7,585,320 B2 | 9/2009 | Hamm et al. |
| 7,687,722 B2 | 3/2010 | Japp et al. |
| 7,759,406 B2 | 7/2010 | Kumon et al. |
| 7,767,219 B2 | 8/2010 | Weber et al. |
| 7,767,736 B2 | 8/2010 | Baran, Jr. |
| 7,814,737 B2 | 10/2010 | Pierson |
| 7,851,055 B2 | 12/2010 | Fukushima |
| 8,741,804 B2 | 6/2014 | Boday et al. |
| 9,186,641 B2 | 11/2015 | Boday et al. |
| 9,434,133 B2 | 9/2016 | Boday et al. |
| 2002/0014154 A1 | 2/2002 | Witzko et al. |
| 2002/0026980 A1 | 3/2002 | Nakatani et al. |
| 2002/0119317 A1 | 8/2002 | Gan et al. |
| 2003/0020163 A1 | 1/2003 | Hung et al. |
| 2003/0022791 A1 | 1/2003 | Asrar et al. |
| 2003/0173255 A1 | 9/2003 | White et al. |
| 2004/0062873 A1 | 4/2004 | Jung et al. |
| 2004/0149127 A1 | 8/2004 | Lyons et al. |
| 2006/0000766 A1 | 1/2006 | Ji |
| 2006/0118490 A1 | 6/2006 | Landry et al. |
| 2006/0276581 A1 | 12/2006 | Ratzsch et al. |
| 2007/0023957 A1 | 2/2007 | Kotov et al. |
| 2007/0164271 A1 | 7/2007 | Wait, Jr. |
| 2007/0215004 A1 | 9/2007 | Kuroda et al. |
| 2007/0241303 A1 | 10/2007 | Zhong et al. |
| 2007/0251393 A1 | 11/2007 | Pope et al. |
| 2007/0257091 A1 | 11/2007 | Kuczynski |
| 2007/0270536 A1 | 11/2007 | Sachdev et al. |
| 2008/0097014 A1 | 4/2008 | Park et al. |
| 2008/0191729 A1 | 8/2008 | Blanco et al. |
| 2008/0193543 A1 | 8/2008 | Morello et al. |
| 2008/0210087 A1 | 9/2008 | Ku et al. |
| 2008/0236804 A1 * | 10/2008 | Cola ..................... B01J 23/745 165/185 |
| 2008/0264563 A1 | 10/2008 | Kuczynski et al. |
| 2009/0004488 A1 | 1/2009 | Park et al. |
| 2009/0117373 A1 | 5/2009 | Wisniewski et al. |
| 2009/0142638 A1 | 6/2009 | Katayama |
| 2010/0027192 A1 | 2/2010 | Perry et al. |
| 2010/0030185 A1 | 2/2010 | Hood et al. |
| 2010/0234481 A1 | 9/2010 | Sugimoto et al. |
| 2010/0240811 A1 | 9/2010 | He et al. |
| 2010/0243520 A1 | 9/2010 | Glover et al. |
| 2011/0092640 A1 | 4/2011 | Tzou |
| 2011/0097416 A1 | 4/2011 | Nguyen et al. |
| 2011/0189381 A1 | 8/2011 | Boday et al. |
| 2012/0187046 A1 | 7/2012 | Boday et al. |
| 2012/0256224 A1 | 10/2012 | Hatanaka et al. |
| 2012/0279768 A1 | 11/2012 | Boday et al. |
| 2013/0034739 A1 | 2/2013 | Boday et al. |
| 2013/0109565 A1 | 5/2013 | Boday et al. |
| 2013/0131244 A1 | 5/2013 | Dickens |
| 2013/0337273 A1 | 12/2013 | Boday et al. |

FOREIGN PATENT DOCUMENTS

| | | | |
|---|---|---|---|
| EP | 0315836 A2 | | 5/1989 |
| JP | 53-42181 A | | 4/1978 |
| JP | 61144339 A | | 7/1986 |
| JP | 2000297094 A | | 10/2000 |
| JP | 2003266598 A | * | 9/2003 |
| JP | 2005197609 A | | 7/2005 |
| WO | 2006/096033 A1 | | 9/2006 |
| WO | 2011078010 A1 | | 6/2011 |

OTHER PUBLICATIONS

Salmon L et al Polymer Composites pp. 715-724 Dec. 1999 vol. 20 No. 6.*
English machine translation of JP 2003266598 (2003).*
Abadi P & Chung D D L Journal of Elec Materi 40 1490 (2011).*
Dean and Gupta article pp. 36-41 (2000).*
Chen et al., "Pervaporation performance of crosslinked polydimethylsiloxane membranes for deep desulfurization of FCC gasoline," Journal of Membrane Science, vol. 322, 2008, pp. 113-121.
U.S. Appl. No. 15/831,428, to Boday et al., entitled "Flame Retardant Filler", filed Dec. 6, 2017, assigned to International Business Machines Corporation.
U.S. Appl. No. 15/831,454, to Boday et al., entitled "Flame Retardant Filler", filed Dec. 6, 2017, assigned to International Business Machines Corporation.
U.S. Appl. No. 15/831,506, to Boday et al., entitled "Flame Retardant Filler", filed Dec. 6, 2017, assigned to International Business Machines Corporation.

(56) References Cited

OTHER PUBLICATIONS

U.S. Appl. No. 13/204,009 to Boday et al., entitled "Microcapsules Adapted to Rupture in a Magnetic Field to Enable Easy Removal of One Substrate From Another for Enhanced Reworkability," filed Aug. 5, 2011.
U.S. Appl. No. 14/930,336, to Boday et al., entitled "Microcapsules Adapted to Rupture in a Magnetic Field to Enable Easy Removal of One Substrate From Another for Enhanced Reworkability", filed Nov. 2, 2015, assigned to International Business Machines Corporation.
U.S. Appl. No. 15/207,016, to Boday et al., entitled "Microcapsules Adapted to Rupture in a Magnetic Field to Enable Easy Removal of One Substrate From Another for Enhanced Reworkability", filed Jul. 11, 2016, assigned to International Business Machines Corporation.
Shang-Hsiu Hu et al., "Controlled Rupture of Magnetic Polyelectrolyte Microcapsules for Drug Delivery," Langmuir, vol. 24, No. 20, pp. 11811-11818, 2008.
B. J. Blaiszik et al., "Microcapsules filled with reactive solutions for self-healing materials," Polymer, vol. 50, pp. 990-997, 2009.
E. N. Brown et al., "In situ poly(urea-formaldehyde) microencapsulation of dicyclopentadiene," Journal of Microencapsulation, vol. 20, No. 6, pp. 719-730, 2003.
M. Yamaura et al., "Preparation and characterization of (3-aminopropyl) triethoxysilane-coated magnetite nanoparticles," Journal of Magnetism and Magnetic Materials, vol. 279, pp. 210-217, 2004.
S. F. Peteu et al., "Responsive Polymers for Crop Protection," Polymers, vol. 2, pp. 229-251, Aug. 19, 2010.
J. Liu et al., "Magnetically Sensitive Alginate-Templated Polyelectrolyte Multilayer Microcapsules for Controlled Release of Doxorubicin," Journal of Physical Chemistry C, vol. 114, No. 17, pp. 7673-7679, Apr. 14, 2010.
M. Alley et al., "Pop-up and/or Starter Fertilizers for Corn," Virginia Cooperative Extension Publication 3002-1438, pp. 1-5, 2010.
Guoliang Zhang, E.L. Cussler, "Hollow fibers as structured distillation packing", Journal of Membrane Science, vol. 215, Issues 1-2, Apr. 15, 2003, pp. 185-193.
J. Andrieu, "Influence of Wettability on Liquid Phase Texture in a Countercurrently Irrigated Packing", Chemical Engineering Science, vol. 30, 1975, pp. 217-220.
Barry S. Hindin, "Silver Sulfide Corrosion Control Using Corrosion Prevention Compounds", Corrosion 2006, Mar. 12-16, 2006, San Diego, California, Paper No. 06264, Copyright 2006, NACE International.
U.S. Appl. No. 12/696,328, to Boday et al., entitled "Anti-Corrosion Conformal Coating for Metal Conductors Electrically Connecting an Electronic Circuit", filed Jan. 29, 2010, assigned to International Business Machines Corporation.
Wikipedia contributors, "Natural gas processing", Wikipedia, The Free Encyclopedia, http://en.wikipedia.org/w/index.php?title=Natural_gas_processing&oldid=400027904 (accessed Dec. 13, 2010), pp. 1-7.
Wikipedia contributors, "Silsesquioxane", Wikipedia, The Free Encyclopedia, http://en.wikipedia.org/w/index.php?title=Silsesquioxane&oldid=402217379 (accessed Dec. 13, 2010), pp. 1-9.
"UCARSOL GT 10 Antifoam", Product Information, Gas Treating Products & Services, The Dow Chemical Company, Midland, Michigan, Published Jul. 2004, pp. 1-4. (Available at http://www.dow.com/gastreating/solution/ngp_osr.htm).
King, David L., et al., "Removal of Sulfur Components from Low Sulfur Gasoline Using Copper Exchanged Zeolite Y at Ambient Temperature", Pacific Northwest Laboratory, Richland, Washington, 2005, 1 page. (Available at http://iic.pnl.gov/abstracts/nacs/p_001.pdf).
"Hydrogen Sulfide Removal Methods", Excel Water Technologies, Inc., Fort Lauderdale, Florida, dated 2007, pp. 1-3. (Available at http://www.excelwater.com/eng/b2c/h2s.php).
I. Manconi et al., "Removal of H2S and Voltatile Organic Sulfur Compounds by Silicone Membrane Extraction", Research Article, Society of Chemical Industry, Aug. 4, 2008, pp. 69-77.
U.S. Appl. No. 13/010,995, to Boday et al., entitled "Silicone-Based Chemical Filter and Silicone-Based Chemical Bath for Removing Sulfur Contaminants", filed Jan. 21, 2011, assigned to International Business Machines Corporation.
U.S. Appl. No. 13/802,543, to Boday et al., entitled "Silicone-Based Chemical Filter and Silicone-Based Chemical Bath for Removing Sulfur Contaminants", filed Mar. 13, 2013, assigned to International Business Machines Corporation.
U.S. Appl. No. 13/802,652, to Boday et al., entitled "Silicone-Based Chemical Filter and Silicone-Based Chemical Bath for Removing Sulfur Contaminants", filed Mar. 13, 2013, assigned to International Business Machines Corporation.
U.S. Appl. No. 15/044,150, to Boday et al., entitled "Removing Sulfur Contaminants From Water Using a Silicone-Based Chemical Filter", filed Feb. 16, 2016, assigned to International Business Machines Corporation.
U.S. Appl. No. 15/044,175, to Boday et al., entitled "Removing Sulfur Contaminants From a Fluid Using a Silicone-Based Chemical Filter", filed Feb. 16, 2016, assigned to International Business Machines Corporation.
Kumar et al., "Instantaneous, Facile and Selective Synthesis of Tetrabromobisphenol A using Potassium Tribromide: An Efficient and Renewable Brominating Agent", Organic Process Research & Development, vol. 14, No. 1, 2010, pp. 174-179, Published on Web Dec. 20, 2009.
U.S. Appl. No. 13/102,306, to Boday et al., entitled "Flame Retardant Filler", filed May 6, 2011, assigned to International Business Machines Corporation.
U.S. Appl. No. 14/512,491, to Boday et al., entitled "Flame Retardant Filler", filed Oct. 13, 2014, assigned to International Business Machines Corporation.
U.S. Appl. No. 15/015,905, to Boday et al., entitled "Flame Retardant Filler", filed Feb. 4, 2016 assigned to International Business Machines Corporation.
"Flame Retardant Fact Sheet; Other Phosphorous Flame Retardants", European Flame Retardants Association, Sep. 28, 2011, 2 pages. http://www.cefic-efra.com/images/stories/factsheet/7OtherPhosphorusFactSheetAB-1_00.pdf).
English Language Translation of Claims in CN101033327 (2007), 2 pages.
U.S. Appl. No. 13/397,010, to Boday et al., entitled "Non-Halogenated Flame Retardant Filler", filed Feb. 15, 2012, assigned to International Business Machines Corporation.
Dean et al., "Characterization of a Thermal Interface Material for Burn-in Application", 2000, 6 pages. <https://www51.honeywell.com/sm/em/common/documents/4.2_technical_papers_2000_4.pdf>.
"Development of Heat-dissipating Sheets achieving both Metal-like High Thermal Conductivity and Flexibility", News Release, Hitachi Chemical Co., Ltd., Japan, Jun. 23, 2009, 3 pages. <http://www.hitachi-chem.co.jp/english/information/2009/n_090623.html>.
"Hi-Flow 225FT; Reworkable, Pressure Sensitive Phase Change Material", Product Brochure, The Bergquist Company, Chanhassen, Minnesota, 2008, 1 page. <http://www.bergquistcompany.com/pdfs/dataSheets/PDS_HF_225FT_12.08_E.pdf>.
U.S. Appl. No. 13/495,132, to Boday et al., entitled "Thermal Interface Material (TIM) With Thermally Conductive Integrated Release Layer", filed Jun. 13, 2012, assigned to International Business Machines Corporation.
Christopher O. Muller, "Control of Corrosive Gases to Avoid Electrical Equipment Failure", Purafil, Inc., webpage: www.purafil.com/literature/control-of-corrosive-gases.pdf, 1999, pp. 1-13.
Manuel A. Rivera, "Design Considerations for Reliable Electrical, Control and Instrumentation Systems in Geothermal Power Plants With Emphasis on Hydrogen Sulphide Related Problems", Geothermal Training Programme; United Nations University; 2007, pp. 461-490.
Ezdine Ferjani et al., "Bulk and surface modification of cellulose diacetate based RO/NF membranes by polymethylhydrosiloxane—Preparation and characterization", Desalination, vol. 146, Issues 1-3, 2002, pp. 325-330.

(56) References Cited

OTHER PUBLICATIONS

Ronald L. Cicero et al., "Photoreactivity of Unsaturated Compounds with Hydrogen-Terminated Silicon (111)", Langmuir, vol. 16, Issue 13, 2000, pp. 5688-5695.
Rosaria Ciriminna, et al., "Closing the Organosilicon Synthetic Cycle: Efficient Heterogeneous Hydrosilylation of Alkenes over SiliaCat Pt(0)", ACS Sustainable Chemistry & Engineering, 2012, 5 pages.
U.S. Appl. No. 13/283,734, to Boday et al., entitled "Microcapsules Adapted to Rupture in a Magnetic Field", filed Oct. 28, 2011, assigned to International Business Machines Corporation.
U.S. Appl. No. 14/244,921, to Boday et al., entitled "Microcapsules Adapted to Rupture in a Magnetic Field", filed Apr. 4, 2014, assigned to International Business Machines Corporation.
U.S. Appl. No. 14/244,964, to Boday et al., entitled "Microcapsules Adapted to Rupture in a Magnetic Field", filed Apr. 4, 2014, assigned to International Business Machines Corporation.
U.S. Appl. No. 14/245,074, to Boday et al., entitled "Microcapsules Adapted to Rupture in a Magnetic Field", filed Apr. 4, 2014, assigned to International Business Machines Corporation.
English language machine translation of abstract of JP53-42181 (1978), 1 page.
CAS Registry No. 2530-83-8, SciFinder, American Chemical Society (ACS), 2015, 1 page.
English translation of DE 19857697 A1, Jun. 15, 2000, 37 pages.
John H. MacMillan, Ph.D., "Homogeneous Platinum Catalysts", United Chemical Technologies, Inc., Oct. 14, 2008, 69 pages.

* cited by examiner

THERMAL INTERFACE MATERIAL (TIM) WITH THERMALLY CONDUCTIVE INTEGRATED RELEASE LAYER

CROSS-REFERENCE TO RELATED APPLICATION

This patent application is a divisional application of pending U.S. patent application Ser. No. 13/495,132, filed Jun. 13, 2012, entitled "THERMAL INTERFACE MATERIAL (TIM) WITH THERMALLY CONDUCTIVE INTEGRATED RELEASE LAYER", which is hereby incorporated herein by reference in its entirety.

BACKGROUND OF THE INVENTION

1. Field of Invention

The present invention relates in general to the field of thermal interface materials. More particularly, the present invention relates to a thermal interface material (TIM) having a covalently-attached thermally conductive release layer, and a method of making the same.

2. Background Art

In general, it is desirable for a thermal interface material (TIM) used for burn-in applications to withstand many burn-in cycles without requiring replacement of the TIM and without leaving residue on the surface of a bare die or other electronic component being burned in. In burn-in applications, the TIM is typically attached to a heat sink and is brought into contact with the electronic component being burned in. Typically, the TIM is provided with an aluminum foil release layer that allows for easy release from the electronic component being burned in without leaving residue on the surface of the electronic component. Unfortunately, conventional TIMs used in burn-in fixtures are non-covalently attached to the aluminum foil release layer and, consequently, have a tendency to shear away from the aluminum foil release layer as the TIM/heat sink assembly is repetitively withdrawn from contact with successive electronic components being burned in over many burn-in cycles.

SUMMARY OF THE INVENTION

In accordance with some embodiments of the present invention, a thermal interface material (TIM) includes a modified release layer having an organosilane-coated surface covalently bound to a TIM formulation layer. The modified release layer may be formed by applying an organosilane (e.g., vinyltriethoxysilane) to the surface of a thermally conductive release layer (e.g., aluminum foil). The organosilane reacts with hydroxyl groups on the surface of the thermally conductive release layer. The TIM formulation layer may be formed by applying a TIM formulation (e.g., a graphite TIM formulation) containing an unsaturated monomer (e.g., methyl acrylate) to the organosilane-coated surface of the modified release layer, and then curing the TIM formulation so that the unsaturated monomer of the TIM formulation reacts with the organosilane-coated surface of the modified release layer.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED EMBODIMENTS

In accordance with some embodiments of the present invention, a thermal interface material (TIM) includes a modified release layer having an organosilane-coated surface covalently bound to a TIM formulation layer. The modified release layer may be formed by applying an organosilane (e.g., vinyltriethoxysilane) to the surface of a thermally conductive release layer (e.g., aluminum foil). The organosilane reacts with hydroxyl groups on the surface of the thermally conductive release layer. The TIM formulation layer may be formed by applying a TIM formulation (e.g., a graphite TIM formulation) containing an unsaturated monomer (e.g., methyl acrylate) to the organosilane-coated surface of the modified release layer, and then curing the TIM formulation so that the unsaturated monomer of the TIM formulation reacts with the organosilane-coated surface of the modified release layer.

Electronic components, such as microprocessors and integrated circuits, typically exhibit a "bathtub" shaped failure curve when the failure rate is plotted against time. Accordingly, a relatively large percentage of electronic components fail early (i.e., a relatively high failure rate is observed early, followed by a low failure rate over the useful life of the electronic components, and then an increasing failure rate after the useful life is exceeded). To screen out electronic components that will fail early, it is not uncommon to perform a burn-in process (especially for high-value electronic components). Typically, a burn-in process powers-on an electronic component being burned in and often maintains the electronic component at an elevated temperature (typically elevated with respect to the operating temperature of the electronic component) for a predetermined period of time to identify and reject any electronic component that is substandard. Performing the burn-in process at an elevated temperature forces failures to occur in a reasonably short time (typically varies from several minutes to several days depending on the application).

Typically, the burn-in process is performed using a burn-in fixture, which incorporates an air or liquid cooled heat sink for controlling the temperature of the electronic com-
} ponent being burned in. While an elevated temperature is desired in order to accelerate early failures in burn-in applications, as discussed above, excessive heat must be withdrawn from the electronic component being burned in to prevent unnecessarily high junction temperatures. Excessive heat degrades electronic component performance, reliability, life expectancy, and can even cause failures that would not have otherwise occurred.

A thermal interface material (TIM) is attached to the heat sink and is brought into contact with the electronic component being burned in. The TIM is typically permanently attached to the heat sink via adhesive. It is generally desirable for the TIM to withstand many burn-in cycles without requiring replacement of the TIM and without leaving residue on the surface of the electronic component being burned in. Typically, the TIM is provided with an aluminum foil release layer that allows for easy release from the electronic component being burned in without leaving residue on the surface of the electronic component. Unfortunately, conventional TIMs used in burn-in fixtures are non-covalently attached to the aluminum foil release layer and, consequently, have a tendency to shear away from the aluminum foil release layer as the TIM/heat sink assembly is withdrawn from contact with successive electronic components being burned in over may burn-in cycles.

To overcome this separation of the TIM from the release layer, in accordance with some embodiments of the present invention, the TIM is covalently attached to the release layer. As noted above, aluminum foil is commonly used as the release layer. Aluminum contains an aluminum oxide external layer. This layer allows for surface modification with silanes. To covalently bind the TIM, the aluminum surface can be modified with a silane containing an unsaturated functionality such as allyl or vinyl functionalities or other functionalities known to those skilled in the art to react during radical polymerizations. The modified aluminum release layer may then be coated with a TIM formulation which contains an unsaturated monomer for chain growth polymerization (e.g., acrylate, acrylonitrile or other suitable monomer known to those skilled in the art), graphite (preferably, 40-60 wt %) or other thermally conductive filler, and a free radical initiator (e.g., AIBN or other suitable free radical initiator known to those skilled in the art). This TIM formulation can also contain polymers or copolymers to be used as mechanical property modifiers. The above examples are non-limiting as the surface can be modified with amines, for example, to covalently attach to other TIM formulations such as TIMs containing epoxies or other monomers for condensation polymerization.

Those skilled in the art will appreciate that the present invention may be used in TIM applications beyond burn-in applications. For example, a TIM having a covalently attached release layer in accordance with some embodiments of the present invention may be used in general TIM applications (e.g., a TIM between a bare die and a heat sink in the case of a bare die module and, as described below, a "TIM1" and/or a "TIM2" in the case of a capped module) to facilitate removability, reworkability and recyclability.

Electronic components, such as microprocessors and integrated circuits, must operate within certain specified temperature ranges to perform effectively. Excessive heat degrades electronic component performance, reliability, life expectancy, and can even cause failure. Heat sinks are widely used for controlling excessive heat. Typically, heat sinks are formed with fins, pins or other similar structures to increase the surface area of the heat sink and thereby enhance heat dissipation as air passes over the heat sink. In addition, it is not uncommon for heat sinks to contain high performance structures, such as vapor chambers and/or heat pipes, to further enhance heat transfer. Heat sinks are typically formed of metals, such as copper or aluminum. More recently, graphite based materials have been used for heat sinks because such materials offer several advantages, such as improved thermal conductivity and reduced weight.

Electronic components are generally packaged using electronic packages (i.e., modules) that include a module substrate to which the electronic component is electronically connected. In some cases, the module includes a cap (i.e., a capped module) which seals the electronic component within the module. In other cases, the module does not include a cap (i.e., a bare die module).

Bare die modules are generally preferred over capped modules from a thermal performance perspective. In the case of a capped module, a heat sink is typically attached with a thermal interface material (TIM) between a bottom surface of the heat sink and a top surface of the cap (i.e., also referred to as "TIM2"), and another thermal interface material (TIM) between a bottom surface of the cap and a top surface of the electronic component (i.e., also referred to as "TIM1"). Bare die modules typically exhibit better thermal performance than capped modules because bare die modules eliminate two sources of thermal resistance present in capped modules, i.e., the thermal resistance of the cap and the thermal resistance of the thermal interface material between the cap and the electronic component (i.e., TIM1). Accordingly, bare die modules are typically used to package electronic components that require high total dissipation.

Heat sinks are attached to modules using a variety of attachment mechanism, such as clamps, screws, and other hardware. The attachment mechanism typically applies a force that maintains a thermal gap, i.e., the thickness of the thermal interface extending between the heat sink and the module. A TIM having a covalently attached release layer in accordance with some embodiments of the present invention may be used in general TIM applications (e.g., a TIM in the case of a bare die module and a "TIM1" and/or a "TIM2" in the case of a capped module) to facilitate removability, reworkability and recyclability. In the case of a bare die module, for example, covalently attaching the TIM to the release layer in accordance with some embodiments of the present invention allows for easy release from the surface of the bare die (and, in turn, allows for easy rework of the bare die) without separation of the TIM from the release layer and without leaving residue on the surface of the bare die.

Figure 1:
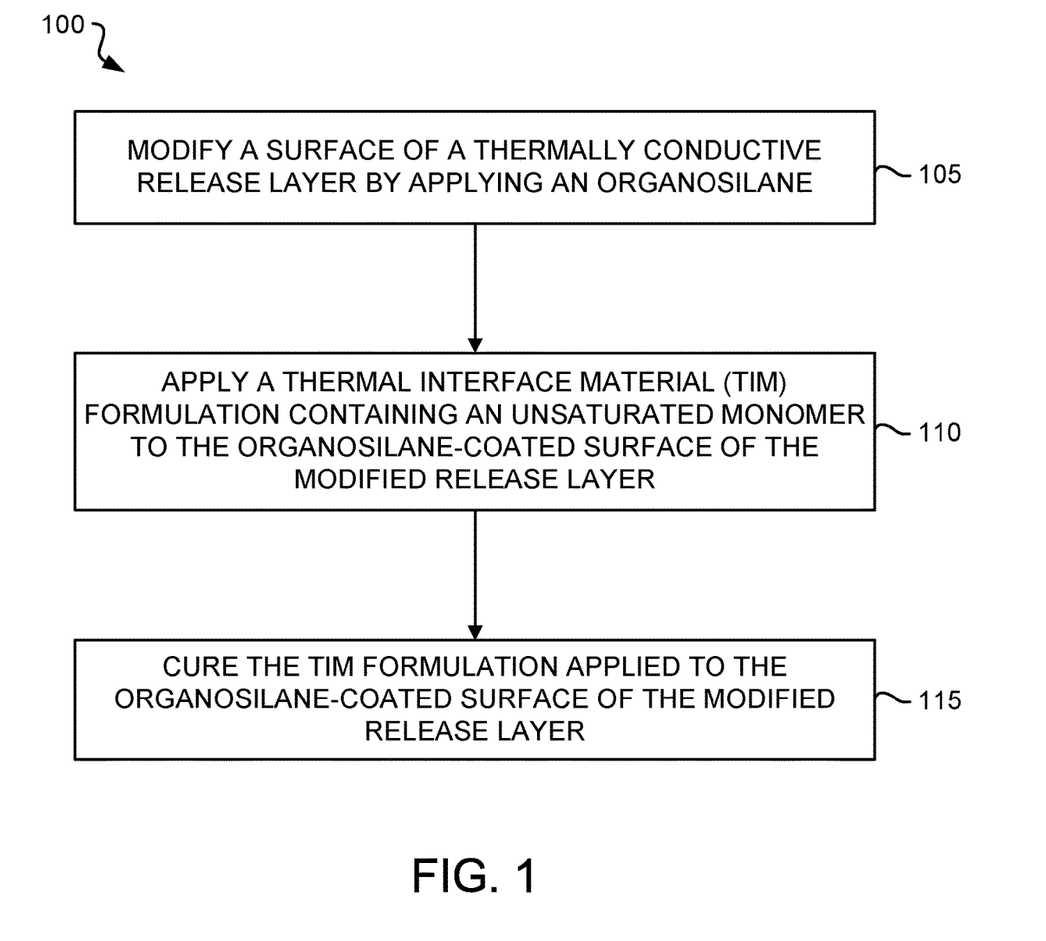
FIG. 1 is a process flow diagram illustrating a method for making a thermal interface material (TIM) with an integrated thermally conductive release layer in accordance with some embodiments of the present invention.

FIG. 1 is a process flow diagram illustrating a method 100 for making a thermal interface material (TIM) with an integrated thermally conductive release layer in accordance with some embodiments of the present invention. In the method 100, the steps discussed below (steps 105-115) are performed. These steps are set forth in their preferred order. It must be understood, however, that the various steps may occur simultaneously.

The method 100 begins by modifying a surface of a thermally conductive release layer by applying an organosilane (step 105). For example, the modified release layer may be formed in this step 105 by applying a trialkoxysilane containing an unsaturated functionality such as allyl or vinyl functionalities (or other suitable functionalities including, but not limited to, functionalities known to those skilled in the art to react during radical polymerizations) to the surface of a suitable thermally conductive release layer, such as aluminum or copper foil. The trialkoxysilane reacts with hydroxyl groups on the surface of the thermally conductive release layer. In general, a suitable thermally conductive release layer must have surface hydroxyl groups (i.e., hydroxyl groups on the surface of the release layer). In accordance with some embodiments of the present invention, an organosilane reacts with these hydroxyl groups to form either a vinyl functionalized release layer surface (e.g., the first step in reaction scheme A shown in FIG. 2, described below) or an amine functionalized release layer surface (e.g., the first step in reaction scheme B shown in FIG. 3, described below), which organosilane-coated surface of the modified release layer is subsequently reacted during polymerization of a TIM formulation. In its most general term, this reaction involves condensation of the organosilane with surface hydroxyls to form Si—O-substrate bonds. If the surface hydroxyls are not present, the condensation reaction cannot ensue.

The method 100 continues by applying a TIM formulation containing an unsaturated monomer to the organosilane-coated surface of the modified release layer (step 110). For example, this step 110 may be performed by applying a graphite TIM formulation containing an unsaturated monomer, graphite, and a free radical initiator to the vinyl functionalized release layer surface (e.g., the second step in reaction scheme A shown in FIG. 2, described below). Optionally, the graphite TIM formulation may also contain one or more polymers and/or one or more copolymers as mechanical property modifiers. Alternatively, this step 110 may be performed by applying an epoxy resin formulation to the amine functionalized release layer surface (e.g., the second step in reaction scheme B shown in FIG. 3, described below).

The method 100 concludes by curing the TIM formulation applied to the organosilane-coated surface of the modified release layer (step 115). For example, this step 115 may be performed by heating the graphite TIM formulation applied to the vinyl functionalized release layer surface in step 110 to 80° C. for a period of time sufficient to accomplish radical polymerization (e.g., the second step in reaction scheme A shown in FIG. 2, described below). Alternatively, this step 115 may be performed by maintaining the epoxy TIM formulation applied to the amine functionalized release layer surface in step 110 at a temperature and for a period of time sufficient to accomplish condensation polymerization (e.g., the second step in reaction scheme B shown in FIG. 3, described below).

A surface of a thermally conductive release layer, such as aluminum foil, is easily functionalized via a suitable functional-group-terminated silane coupling agent. Suitable functional-group-terminated silane coupling agents include, but are not limited to, vinyl-terminated trialkoxysilanes, allyl-terminated trialkoxysilanes, amine-terminated trialkoxysilanes, and isocyanate-terminated trialkoxysilanes.

For example, a conventional vinyl-terminated silane coupling agent, such as vinyltriethoxysilane, may be reacted with a surface of a thermally conductive release layer using procedures well known to those skilled in the art to prepare a vinyl functionalized release layer surface. This example corresponds to the first step in reaction scheme A shown in FIG. 2, described below. Subsequently, in the second step in reaction scheme A shown in FIG. 2, described below, a graphite TIM formulation containing a vinyl-terminated monomer is coupled to the vinyl functionalized release layer surface through radical polymerization.

One skilled in the art will appreciate, however, that other coupling mechanisms may be utilized in lieu of radical polymerization in the second step in reaction scheme A. For example, olefin metathesis catalyzed coupling may be used in lieu of radical polymerization. Olefin metathesis catalyzed coupling is typically performed at room temperature using conventional procedures well known to those skilled in the art. This reaction is performed in the presence of an olefin metathesis catalyst such as Grubbs' catalyst (first generation (G1) and/or second generation (G2)), Schrock akylidenes, or other catalysts known to those skilled in the art within a suitable solvent such as dichloromethane (DCM) or other solvent known to those skilled in the art to dissolve the olefin catalyst.

In another example, a conventional amine-terminated silane coupling agent, such as aminopropyltriethoxysilane, may be reacted with a surface of a thermally conductive release layer using procedures well known to those skilled in the art to prepare an amine functionalized release layer surface. This example corresponds to the first step in reaction scheme B shown in FIG. 3, described below. Subsequently, in the second step in reaction scheme B shown in FIG. 3, described below, an epoxy TIM formulation is coupled to the amine functionalized release layer surface through condensation polymerization.

A surface of a thermally conductive release layer, such as aluminum foil, is also easily hydrosilated via a suitable hydrogen-terminated silane coupling agent. For example, a conventional hydrogen-terminated silane coupling agent, such as triethoxysilane, may be reacted with a surface of a thermally conductive release layer using procedures well known to those skilled in the art to prepare a hydrosilated terminated release layer surface. Subsequently, a TIM formulation containing a vinyl-terminated monomer may be coupled to the hydrosilated terminated release layer surface through hydrosilylation catalyzed coupling using a hydrosilylation catalyst such as Karstedt's catalyst (platinum(0)-1, 3-divinyl-1,1,3,3-tetramethyldisiloxane complex solution) or other catalyst known to those skilled in the art within a suitable solvent such as toluene or other solvent known to those skilled in the art to dissolve the hydrosilylation catalyst. Hydrosilylation coupling is typically performed at room temperature using conventional procedures well known to those skilled in the art.

The hydrosilylation catalyst used in the hydrosilylation catalyzed coupling reaction is typically a Pt catalyst. The preferred Pt catalyst is Karstedt's catalyst. However, one skilled in the art will appreciate that any of a number of other catalysts may be used. For example, [Cp*Ru(MeCN)$_3$]PF$_6$ (available from Sigma-Aldrich, St. Louis, Mo.) is a hydrosilylation catalyst that may be utilized. Using [Cp*Ru(MeCN)$_3$]PF$_6$ catalyst, 2-5 mol % catalyst is typically used in acetone at room temperature.

As used herein, including the claims, the term "organosilane" includes functional-group-terminated coupling agents such as vinyl-terminated trialkoxysilanes, allyl-terminated trialkoxysilanes, amine-terminated trialkoxysilanes, and isocyanate-terminated trialkoxysilanes, as well as hydrogen-terminated silane coupling agents.

Typically, a coupling agent is used to join to disparate surfaces. In the manufacture of printed circuit boards (PCBs), a silane coupling agent is often used to join a varnish coating (e.g., an epoxy-based resin) to a substrate (e.g., glass cloth) to define a laminate, or laminated structure. The silane coupling agent typically consists of an organofunctional group to bind the varnish coating and a hydrolyzable group that binds to the surface of the substrate. In particular, the alkoxy groups on the silicon hydrolyze to silanols, either through the addition of water or from residual water on the surface of the substrate. Subsequently, the silanols react with hydroxyl groups on the surface of the substrate to form a siloxane bond (Si—O—Si) and eliminate water.

Reaction Scheme A

Figure 2:
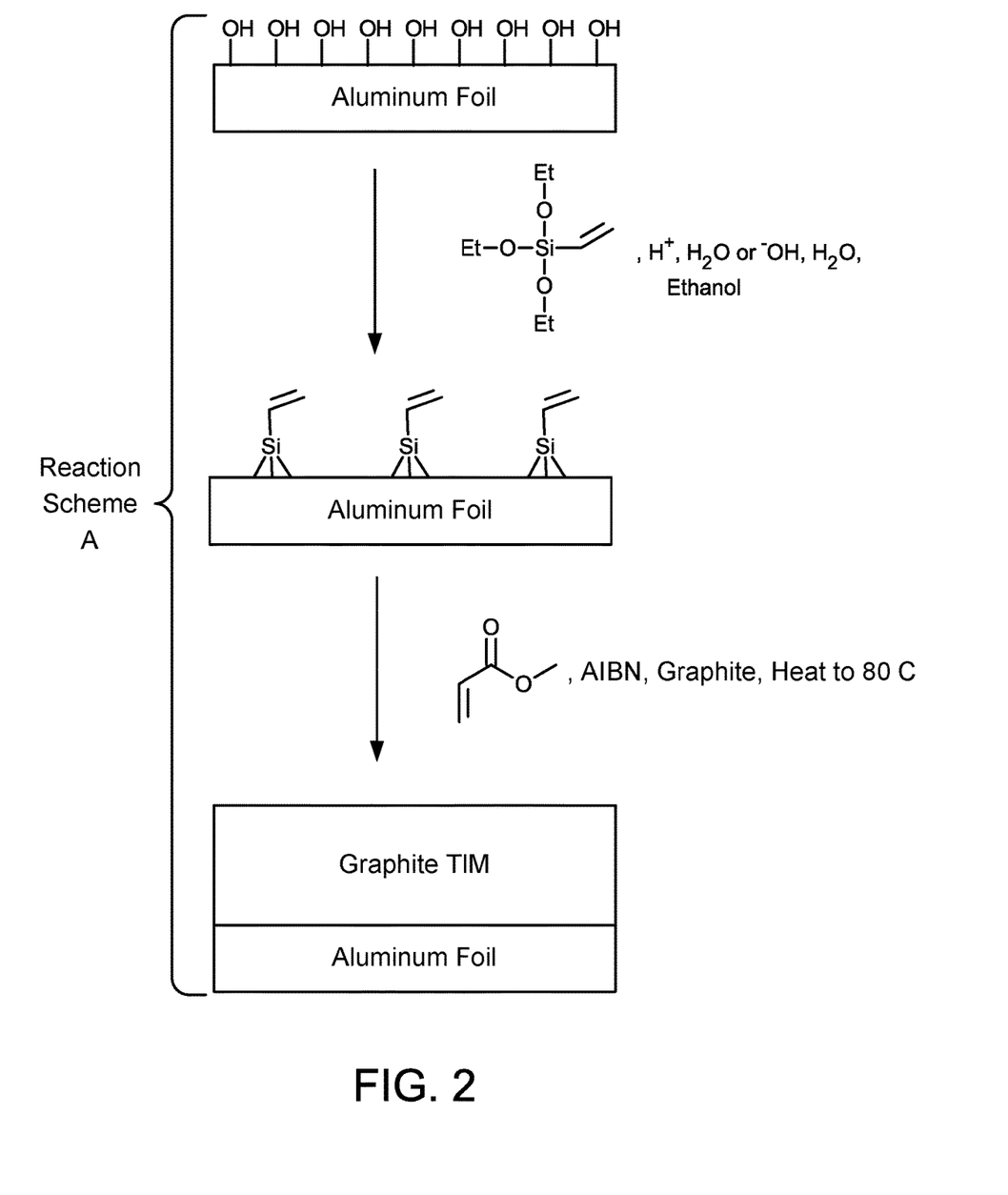
FIG. 2 is a reaction scheme illustrating a method for synthesizing a graphite thermal interface material (TIM) with an integrated aluminum foil release layer by modifying a surface of the release layer using a vinyl-terminated silane, and then applying and curing a graphite TIM formulation that includes an acrylate monomer, a free radical initiator, and graphite in accordance with some embodiments of the present invention.

FIG. 2 is a reaction scheme (reaction scheme A) illustrating a method for synthesizing a graphite thermal interface material (TIM) with an integrated aluminum foil release layer by modifying a surface of the release layer using a vinyl-terminated silane, and then applying and curing a graphite TIM formulation that includes an acrylate monomer, a free radical initiator, and graphite in accordance with some embodiments of the present invention. Hence, reaction scheme A has two steps. In reaction scheme A, the aluminum foil release layer is denoted as "Aluminum Foil" and the graphite thermal interface material (TIM) layer is denoted as "Graphite TIM". In the first step of reaction scheme A, a vinyl functionalized release layer surface is produced by reacting a surface of the aluminum foil release layer and vinyltriethoxysilane. Vinyltriethoxysilane is a commercially available, conventional vinyl-terminated silane coupling agent. In the second step of reaction scheme A, a graphite TIM formulation containing methyl acrylate monomer, azobisisobutyronitrile (AIBN), and graphite is coupled through radical polymerization to the vinyl functionalized release layer surface produced in the first step. Methyl acrylate monomer is a commercially available acrylate monomer. AIBN is a commercially available free radical initiator. Graphite is a commercially available thermally conductive filler.

The aluminum foil release layer may have any suitable thickness. Typically, the aluminum foil release layer has a thickness of approximately 10-75 μm, preferably approximately 20-25 μm.

The graphite TIM layer may have any suitable thickness. Typically, the graphite TIM layer has a thickness of approximately 100-300 μm.

Graphite is commercially available in myriad forms. Suitable forms of graphite for use in accordance with in the second step of reaction scheme A include, but are not limited to, natural graphite, synthetic graphite, graphite fibers, pyrolytic graphite, Kish graphite, graphene, charcoal, carbon nanotubes, fullerenes and other non-carbon thermally conductive fillers. Typically, the graphite particles have an average particle size of approximately 20-500 μm, preferably approximately 40-400 μm. The graphite particles may be vertically oriented in the graphite TIM layer to enhance heat transfer. Typically, vertically oriented graphite particles have an average aspect ratio of 2 or more. Vertical alignment of these thermally conductive particles inside the graphite TIM layer can facilitate thermal conduction along the orientation direction of the particles.

In the first step of reaction scheme A, any suitable thermally conductive release layer may be used in lieu of the aluminum foil release layer. Suitable thermally conductive release layers include, but are not limited to, aluminum, indium, copper, and combinations thereof (e.g., alloys and claddings). Also, any silane containing an unsaturated functionality such as allyl or vinyl functionalities may be used in lieu of vinyltriethoxysilane. For example, vinyltrimethoxysilane may be used in lieu of vinyltriethoxysilane.

In the second step of reaction scheme A, any suitable unsaturated monomer may be used in lieu of methyl acrylate. Suitable unsaturated monomers include, but are not limited to, acrylates, acrylonitrile, and the like. Also, any suitable free radical initiator may be used in lieu of AIBN. Suitable free radical initiators include, but are not limited to, AIBN, benzoyl peroxides (BPOs) (e.g., dibenzoylperoxide and bis(dichlorobenzoyl)-peroxide), and the like. Typically, the reaction occurs at approximately 80° C. using AIBN, and at approximately 100° C. using BPO. Any suitable thermally conductive filler may be used in lieu of, or in addition to, graphite. Suitable thermally conductive fillers include, but are not limited to, graphite, boron nitride (BN), and the like. Boron nitride is commercially available in myriad forms. Spherical boron nitride powder, for example, is commercially available from GE Advanced Ceramics of Strongsville, Ohio. The graphite and/or other suitable thermally conductive filler may be vertically oriented in the TIM layer to enhance heat transfer. Typically, vertically oriented graphite and/or other suitable thermally conductive filler particles have an average aspect ratio of 2 or more. Vertical alignment of these thermally conductive particles inside the TIM layer can facilitate thermal conduction along the orientation direction of the particles.

Preferably, the graphite TIM formulation contains 40-60 wt % graphite and/or other suitable thermally conductive fillers. Additionally, the graphite TIM formulation may optionally contain one or more polymers and/or one or more copolymers as mechanical property modifiers.

Only three silane coupling agent reaction sites are illustrated in the first step of the reaction scheme A for the sake of clarity. Each silane coupling agent reaction site includes a silicon atom that attaches onto the release layer surface, typically via three bonds each formed at an available hydroxyl group on the surface of the release layer. While only three silane coupling agent reaction sites are illustrated in the first step of the reaction scheme A, it is typically desirable to maximize the layer-to-layer covalent attachment produced in the second step of the reaction scheme A (i.e., the attachment of the graphite TIM layer to the release layer) by reacting a quantity of the silane sufficient to react with all of the available hydroxyl groups on the surface of the release layer in the first step of the reaction scheme A. Hence, it is typically desirable to determine the number of available hydroxyl groups on the surface of the release layer and then, in turn, determine a quantity of silane coupling agent sufficient to react with all of those available hydroxyl groups. Generally, stoichiometric quantities of the reactants may be used in the first step of the reaction scheme A (i.e., one silicon atom/three available hydroxyl groups). However, the relative quantity of the reactants may be adjusted in the first step of the reaction scheme A to achieve a desired level of interlayer covalent attachment produced in the second step of the reaction scheme A.

The first step of the reaction scheme A is performed at room temperature using conventional procedures well known to those skilled in the art. The reaction conditions may be either acidic or basic. For example, the reaction may be performed in an acid bath having a pH of approximately 4.5. Either HCl or acetic acid, for example, may be used to drop the pH to 4.5 or lower. Alternatively, the reaction may be performed in a bath having a basic pH. In this case, a pH of 7-12 is preferred, most preferred is pH=10. Either ammonium or sodium hydroxide, for example, may be used to raise the pH to 7 or higher. In either case, the reaction is typically performed in the presence of ethanol (or methanol) and water. Typically, methanol is preferred for trimethoxysilanes, while ethanol is preferred for triethoxysilanes.

With respect to the second step of the reaction scheme A, it is typically desirable to maximize the interlayer covalent attachment produced in this second step by reacting a quantity of the methyl acrylate sufficient to react with all of the available vinyl groups of the vinyl functionalized release layer surface produced in the first step of the reaction scheme A. Generally, stoichiometric quantities of the reactants may be used. However, the relative quantity of the reactants may be adjusted to achieve the desired interlayer covalent attachment. The second step of the reaction scheme A is performed using conventional procedures well known to those skilled in the art. The reaction is performed in the presence of AIBN or other suitable free radical initiator. Typically, the reaction occurs at approximately 80° C. using AIBN.

Example (Reaction Scheme A)

An acid bath for use in the first step of the reaction scheme A is prepared. A surface of aluminum foil (20 µm thickness) is vinyl functionalized by placing the aluminum foil in the acid bath for 2 hours. The acid bath includes: vinyltriethoxysilane (1-5 wt %); ethanol (90-98 wt %); and water (0.1-5 wt %). The pH of acid bath is dropped to approximately 4.5 using acetic acid. Vinyltriethoxysilane is a commercially available vinyl-terminated silane coupling agent. The aqueous solution of acid acts as a catalyst. A graphite TIM formulation for use in the second step of the reaction scheme A is prepared. The graphite TIM formulation includes: methyl methacrylate (40-70 wt %); AIBN (0.1-5 wt %); and graphite (20-60 wt %). Methyl methacrylate is a commercially available acrylate monomer. AIBN is a commonly used free radical initiator. The graphite particles have an average particle size of 0.1-5 µm. The graphite TIM formulation is applied to the vinyl functionalized aluminum foil produced in the first step of reaction Scheme A. The graphite TIM is cured for 1-5 hours at 80° C.

Optionally, the graphite TIM formulation may be interposed (i.e., "TIM sandwich" style) between the vinyl functionalized aluminum foil release layer produced in the first step of reaction scheme A and a conventional TIM, such as "Graphite/Resin High Thermal Conductive Sheet" or "BN/Resin High Thermally Conductive Sheet" available from Hitachi Chemical Co. Ltd, Tokyo, Japan. The graphite TIM formulation may be dispensed from a syringe, for example, to place the formulation between the vinyl functionalized aluminum foil release layer and the conventional TIM.

Reaction Scheme B

Figure 3:
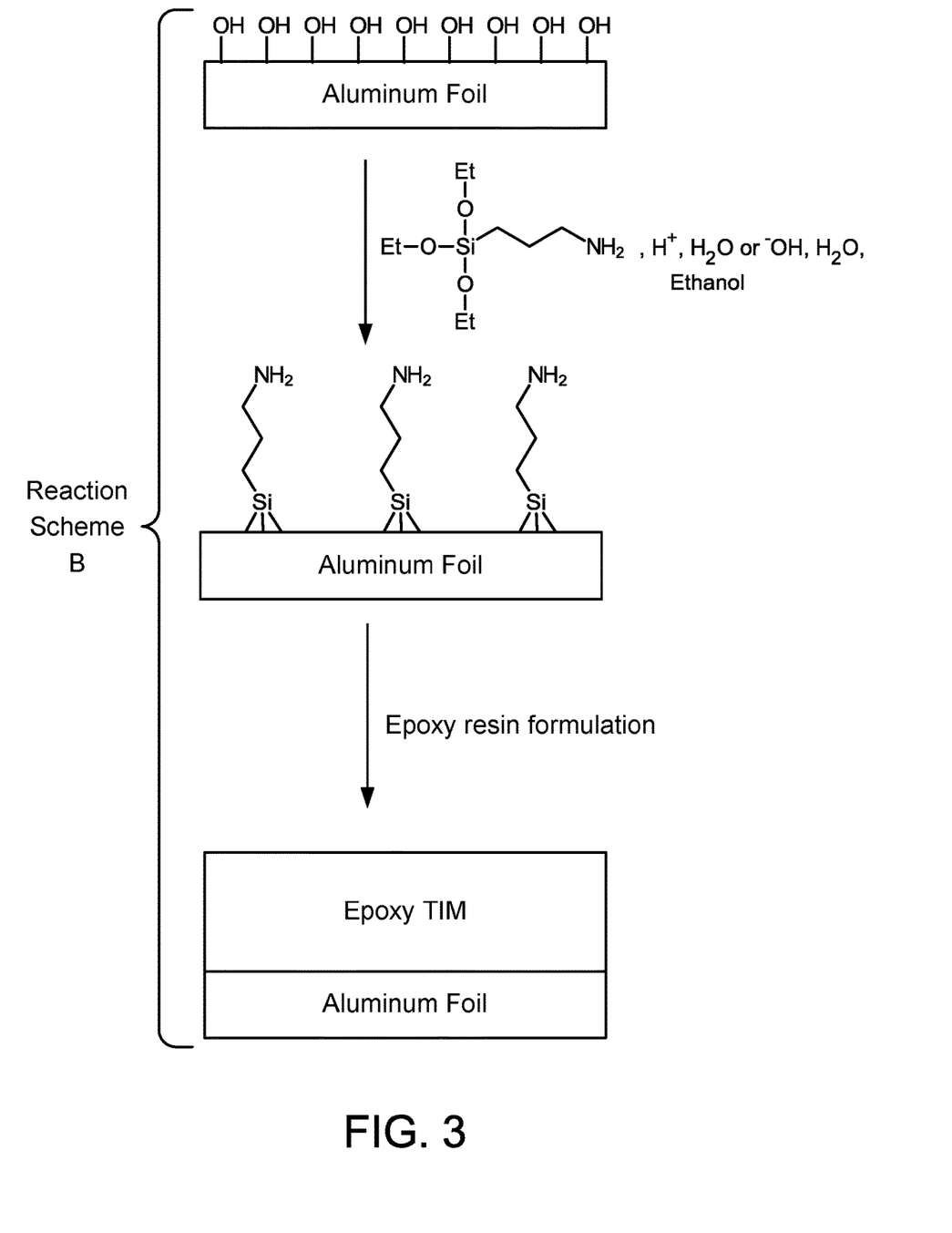
FIG. 3 is a reaction scheme illustrating a method for synthesizing an epoxy thermal interface material (TIM) with an integrated aluminum foil release layer by modifying a surface of the release layer using an amine-terminated silane, and then applying and curing an epoxy resin formulation in accordance with some embodiments of the present invention.

FIG. 3 is a reaction scheme (reaction scheme B) illustrating a method for synthesizing an epoxy thermal interface material (TIM) with an integrated aluminum foil release layer by modifying a surface of the release layer using an amine-terminated silane, and then applying and curing an epoxy resin formulation in accordance with some embodiments of the present invention. Hence, reaction scheme B has two steps. In reaction scheme B, the aluminum foil release layer is denoted as "Aluminum Foil" and the epoxy thermal interface material (TIM) layer is denoted as "Epoxy TIM". In the first step of reaction scheme B, an amine functionalized release layer surface is produced by reacting a surface of the aluminum foil release layer and aminopropyltriethoxysilane. Aminopropyltriethoxysilane is a commercially available, conventional amine-terminated silane coupling agent. In the second step of reaction scheme B, a TIM formulation containing an epoxy resin is coupled through condensation polymerization to the amine functionalized release layer surface produced in the first step.

The aluminum foil release layer may have any suitable thickness. Typically, the aluminum foil release layer has a thickness of approximately 10-75 µm, preferably approximately 20-25 µm.

The epoxy TIM layer may have any suitable thickness. Typically, the epoxy TIM layer has a thickness of approximately 100-300 µm.

In the first step of reaction scheme B, any suitable thermally conductive release layer may be used in lieu of the aluminum foil release layer. Suitable thermally conductive release layers include, but are not limited to, aluminum, indium, copper, and combinations thereof (e.g., alloys and claddings). Also, any silane containing an amine functionality may be used in lieu of aminopropyltriethoxysilane. For example, trimethoxy[3-(methylamino)propyl]silane or [3-(2-aminoethylamino)propyl]trimethoxysilane may be used in lieu of aminopropyltriethoxysilane.

In the second step of reaction scheme B, any suitable TIM formulation containing epoxies or other monomers for condensation polymerization may be used. Suitable TIM formulation monomers include, but are not limited to, bisphenol-A type epoxy resins, polyglycol di-epoxide liquid resins, and the like. Bisphenol A type epoxy resins, which are produced from bisphenol A and epichloroydrin, are commercially available. Depending on the application, flexible resins such as polyglycol di-epoxide liquid resins may be preferred to impart flexibility to the epoxy TIM layer. Polyglycol di-epoxide liquid resins, which are produced from polypropylene glycol and epichlorohydrin, are commercially available.

The epoxy TIM formulation may optionally contain one or more polymers and/or one or more copolymers as mechanical property modifiers.

Also, the epoxy TIM formulation may optionally contain one or more suitable thermally conductive fillers, such as graphite, boron nitride (BN), or the like. For example, thermally conductive fillers may occupy 40-60 wt % of the epoxy TIM formulation. Graphite is commercially available in myriad forms. Suitable forms of graphite for use in accordance with in the second step of reaction scheme B include, but are not limited to, natural graphite, synthetic graphite, graphite fibers, pyrolytic graphite, Kish graphite, graphene, charcoal, carbon nanotubes, and fullerenes. Typically, the graphite particles have an average particle size of approximately 20-500 µm, preferably approximately 40-400 µm. Boron nitride is also commercially available in myriad forms. Spherical boron nitride powder, for example, is commercially available from GE Advanced Ceramics of Strongsville, Ohio. The graphite and/or other suitable thermally conductive filler may be vertically oriented in the epoxy TIM layer to enhance heat transfer. Typically, vertically oriented graphite and/or other suitable thermally conductive filler particles have an average aspect ratio of 2 or more. Vertical alignment of these thermally conductive particles inside the epoxy TIM layer can facilitate thermal conduction along the orientation direction of the particles.

Only three silane coupling agent reaction sites are illustrated in the first step of the reaction scheme B for the sake of clarity. Each silane coupling agent reaction site includes a silicon atom that attaches onto the release layer surface, typically via three bonds each formed at an available hydroxyl group on the surface of the release layer. While only three silane coupling agent reaction sites are illustrated in the first step of the reaction scheme B, it is typically desirable to maximize the layer-to-layer covalent attachment produced in the second step of the reaction scheme B (i.e., the attachment of the epoxy TIM layer to the release layer)

by reacting a quantity of the silane sufficient to react with all of the available hydroxyl groups on the surface of the release layer in the first step of the reaction scheme B. Hence, it is typically desirable to determine the number of available hydroxyl groups on the surface of the release layer and then, in turn, determine a quantity of silane coupling agent sufficient to react with all of those available hydroxyl groups. Generally, stoichiometric quantities of the reactants may be used in the first step of the reaction scheme B (i.e., one silicon atom/three available hydroxyl groups). However, the relative quantity of the reactants may be adjusted in the first step of the reaction scheme B to achieve a desired level of interlayer covalent attachment produced in the second step of the reaction scheme B.

The first step of the reaction scheme B is performed at room temperature using conventional procedures well known to those skilled in the art. The reaction conditions may be either acidic or basic. For example, the reaction may be performed in an acid bath having a pH of approximately 4.5. Either HCl or acetic acid, for example, may be used to drop the pH to 4.5 or lower. Alternatively, the reaction may be performed in a bath having a basic pH. In this case, a pH of 7-12 is preferred, most preferred is pH=10. Either ammonium or sodium hydroxide, for example, may be used to raise the pH to 7 or higher. In either case, the reaction is typically performed in the presence of ethanol (or methanol) and water. Typically, methanol is preferred for trimethoxysilanes, while ethanol is preferred for triethoxysilanes.

With respect to the second step of the reaction scheme B, it is typically desirable to maximize the interlayer covalent attachment produced in this second step by reacting a quantity of the epoxy resin sufficient to react with all of the available amine groups of the amine functionalized release layer surface produced in the first step of the reaction scheme B. Generally, stoichiometric quantities of the reactants may be used. However, the relative quantity of the reactants may be adjusted to achieve the desired interlayer covalent attachment. The second step of the reaction scheme B is performed using conventional procedures well known to those skilled in the art.

Curing typically occurs at a temperature in a range between approximately 20-250° C., more typically in a range between approximately 50-150° C. Also, curing typically occurs in a range between approximately 1 atmosphere (atm) to approximately 5000 pounds per square inch (psi), more typically in a range between approximately 1 atm to approximately 100 psi. In addition, curing may occur over a period in a range between approximately 30 seconds to approximately 5 hours, and more typically in a range between approximately 90 seconds to approximately 120 minutes. Optionally, the cured epoxy TIM can be post-cured at a temperature in a range between approximately 120-150° C. over a period of approximately 1-4 hours.

Example (Reaction Scheme B)

An acid bath for use in the first step of the reaction scheme B is prepared. A surface of aluminum foil (20 µm thickness) is amine functionalized by placing the aluminum foil in the acid bath for up to 2 hours. The acid bath includes: aminopropyltriethoxysilane (1-5 wt %); ethanol (90-98 wt %); and water (0.1-5 wt %). The pH of acid bath is dropped to approximately 4.5 using acetic acid. Aminopropyltriethoxysilane is a commercially available amine-terminated silane coupling agent. The aqueous solution of acid acts as a catalyst. An epoxy resin formulation for use in the second step of the reaction scheme B is prepared. The epoxy resin formulation includes: EPIKOTE Resin 828LVEL (available from Momentive Specialty Chemicals, Inc., Columbus, Ohio) (100 parts); dicyandiamide (5 parts); and 2-ethyl-4-methylimidazole (1 part). EPIKOTE Resin 828LVEL is a biphenol-A type epoxy resin produced from bisphenol A and epichlorohydrin. Dicyandiamide and 2-ethyl-4-methylimidazole are commonly used curing agents. The epoxy resin formulation is applied to the amine functionalized aluminum foil produced in the first step of reaction Scheme B. The epoxy resin formulation is initially cured for 1 hour at 100° C., and subsequently cured for 1 hour at 150° C.

Optionally, the epoxy resin formulation may be interposed (i.e., "TIM sandwich" style) between the amine functionalized aluminum foil release layer produced in the first step of reaction scheme B and a conventional TIM, such as "Graphite/Resin High Thermal Conductive Sheet" or "BN/Resin High Thermally Conductive Sheet" available from Hitachi Chemical Co. Ltd, Tokyo, Japan. The epoxy resin formulation may be dispensed from a syringe, for example, to place the formulation between the amine functionalized aluminum foil release layer and the conventional TIM.

Figure 4:
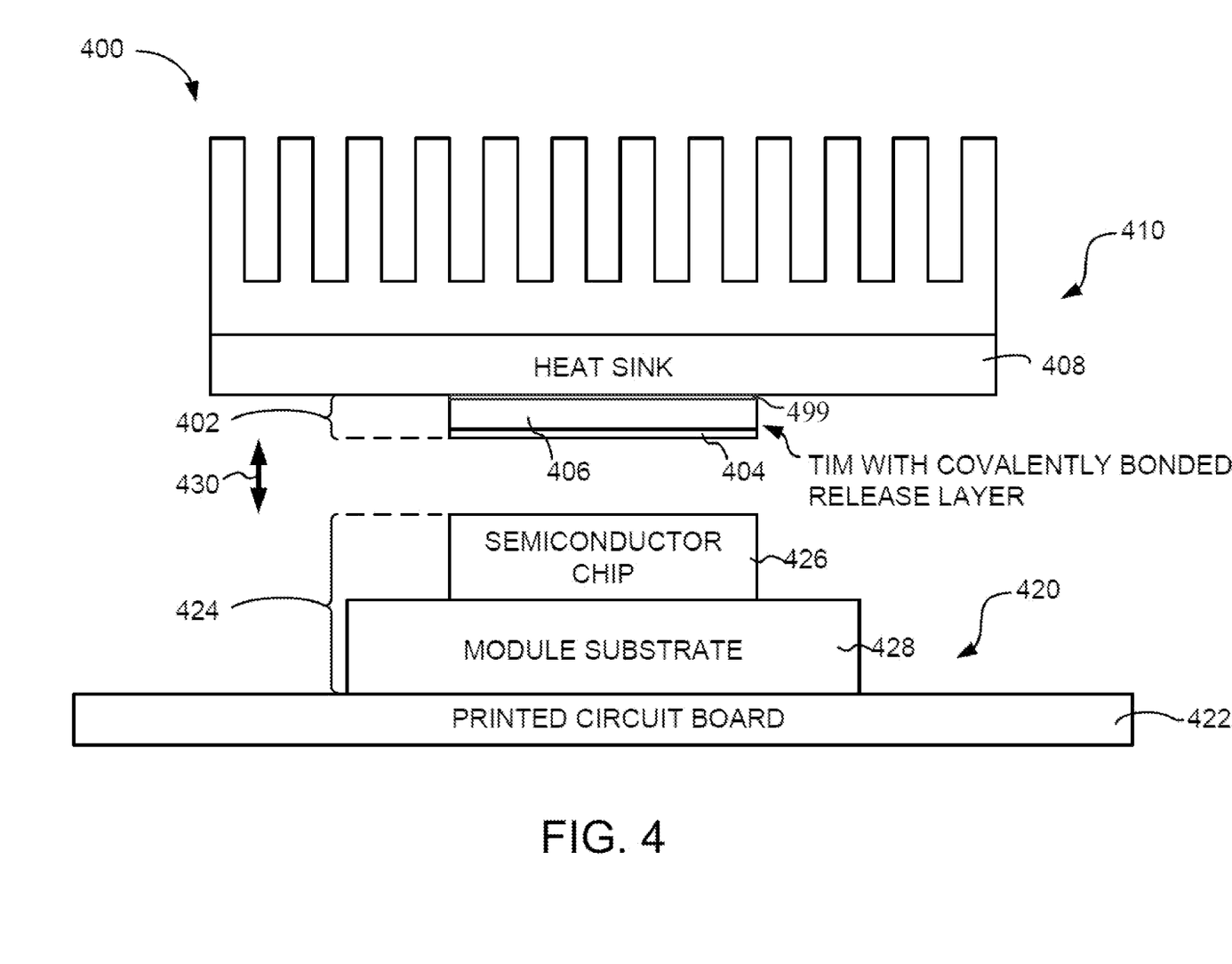
FIG. 4 is a block diagram illustrating an exemplary burn-in fixture that incorporates a thermal interface material (TIM) with a thermally conductive integrated release layer in accordance with some embodiments of the present invention.

FIG. 4 is a block diagram illustrating an exemplary burn-in fixture 400 that incorporates a thermal interface material (TIM) 402 with a thermally conductive integrated release layer 404 in accordance with some embodiments of the present invention. The TIM 402 is comprised of a TIM layer 406 that is covalently attached to the release layer 404. This covalent attachment may be achieved by employing the methods described above with reference to FIGS. 1-3. Typically, the TIM 402 is permanently attached to a heat sink 408 via adhesive 499. This combined structure is referred to herein as the heat sink/TIM assembly 410.

One skilled in the art will appreciate that a burn-in fixture may be used to burn in myriad types of electronic components. In the exemplary burn-in fixture 400 illustrated in FIG. 4, a circuit board assembly 420 is configured to receive a bare die module for burn-in. The particular configuration of the circuit board assembly 420 shown in FIG. 4 is for purposes of example, not limitation. One skilled in the art will appreciate that a circuit board assembly may be configured to receive any type of electronic component for burn-in. For example, the electronic component may be received in a burn-in socket.

In the exemplary configuration shown in FIG. 4, the circuit board assembly 420 includes a printed circuit board 422 and a bare die module 424. The bare die module 424 includes an electronic component such as a semiconductor chip 426, a module substrate 428, and an electronic connection (not shown). The semiconductor chip 426 is electrically connected to the module substrate 428. The electronic connection, which electrically connects the printed circuit board 422 to the module substrate 428 may be a pin grid array (PGA), a ceramic column grid array (CCGA), a land grid array (LGA), or the like.

During each burn-in cycle, the heat sink/TIM assembly 410 typically moves in a vertical motion (denoted by line 430) to come into contact with the circuit board assembly 422 when the burn-in process begins and withdraws from contact when the burn-in process ends. More particularly, the release layer 404 makes contact with the semiconductor chip 426 during the burn-in process. Typically, the TIM 422 is loaded in compression during the burn-in cycle and preferably possesses sufficient compliance to address possible coplanarity deviation between the lower surface of the heat sink 408 and the upper surface of the semiconductor chip 426 and, thereby, maintain contact across the entire upper surface of the semiconductor chip 426.

In lieu of the vertical motion engagement shown in FIG. 4, the burn-in fixture 400 may employ a clam-shell type engagement of the heat sink/TIM assembly 410 onto the circuit board assembly 422. However, such a clam-shell type engagement disadvantageously increases shear on the TIM 402 as the heat sink/TIM assembly 410 is withdrawn from engagement from the circuit board assembly 422.

It is desirable for the TIM 402 to withstand many burn-in cycles without requiring replacement of the TIM 402 and without leaving a residue on the surface of the semiconductor chip 426. Covalent attachment of the TIM layer 406 to the release layer 404 in accordance with some embodiments of the present invention overcomes the tendency of conventional TIMs to shear away from the release layer as the heat sink/TIM assembly is repetitively withdrawn from contact with successive electronic components being burned in over many burn-in cycles.

One skilled in the art will appreciate that many variations are possible within the scope of the present invention. Thus, while the present invention has been particularly shown and described with reference to preferred embodiments thereof, it will be understood by those skilled in the art that these and other changes in form and details may be made therein without departing from the spirit and scope of the present invention.

What is claimed is:

1. An assembly, comprising:
   a thermal interface material sheet, hereinafter referred as the TIM sheet, wherein the TIM sheet is selected from the group consisting of a thermal conductive sheet containing graphite and resin and a thermally conductive sheet containing boron nitride and resin;
   a modified release layer having an organosilane-coated surface formed by modifying a surface of a thermally conductive release layer by applying an organosilane to the surface of the thermally conductive release layer, wherein the organosilane reacts with hydroxyl groups on the surface of the thermally conductive release layer, and wherein the thermally conductive release layer is aluminum foil;
   a thermal interface material formed by curing a thermal interface material formulation comprising an unsaturated monomer interposed between the organosilane-coated surface of the modified release layer and the TIM sheet, wherein the unsaturated monomer of the thermal interface material formulation reacts with the organosilane-coated surface of the modified release layer by reacting with the organosilane though polymerization, and wherein the cured thermal interface material formulation reacted with the organosilane-coated surface of the modified release layer provides a thermal interface material with an integrated thermally conductive release layer.

2. An assembly, comprising:
   a thermal interface material sheet, hereinafter referred as the TIM sheet, wherein the TIM sheet is selected from the group consisting of a thermal conductive sheet containing graphite and resin and a thermally conductive sheet containing boron nitride and resin;
   a modified release layer having an organosilane-coated surface formed by modifying a surface of a thermally conductive release layer by applying an organosilane to the surface of the thermally conductive release layer, wherein the organosilane reacts with hydroxyl groups on the surface of the thermally conductive release layer;
   a thermal interface material formed by curing a thermal interface material formulation comprising an unsaturated monomer interposed between the organosilane-coated surface of the modified release layer and the TIM sheet, wherein the unsaturated monomer of the thermal interface material formulation reacts with the organosilane-coated surface of the modified release layer by reacting with the organosilane though polymerization, wherein the cured thermal interface material formulation reacted with the organosilane-coated surface of the modified release layer provides a thermal interface material with an integrated thermally conductive release layer, wherein the organosilane is a vinyl-terminated trialkoxysilane having a terminal vinyl group, and wherein the unsaturated monomer of the thermal interface material formulation reacts with the organosilane-coated surface of the modified release layer by reacting with the terminal vinyl group of the vinyl-terminated trialkoxysilane through radical polymerization.

3. The assembly as recited in claim 2, wherein the unsaturated monomer of the thermal interface material formulation comprises an acrylate, and wherein the thermal interface material formulation further comprises a thermally conductive filler and a free radical initiator.

4. The assembly as recited in claim 3, wherein the acrylate is methyl acrylate, wherein the thermally conductive filler is graphite, and wherein the free radical initiator is azobisisobutyronitrile.

5. The assembly as recited in claim 2, wherein the unsaturated monomer of the thermal interface material formulation comprises acrylonitrile, and wherein the thermal interface material formulation further comprises a thermally conductive filler and a free radical initiator.

6. The assembly as recited in claim 5, wherein the thermally conductive filler is graphite, and wherein the free radical initiator is azobisisobutyronitrile.

7. The assembly as recited in claim 1, wherein the TIM sheet is permanently attached via adhesive to a heatsink of a burn-in fixture, and wherein the integrated thermally conductive release layer temporarily contacts an electronic component received in a burn-in socket of the burn-in fixture.

8. The assembly as recited in claim 2, wherein the TIM sheet is permanently attached via adhesive to a heatsink of a burn-in fixture, and wherein the integrated thermally conductive release layer temporarily contacts an electronic component received in a burn-in socket of the burn-in fixture.

* * * * *